United States Patent
Larson et al.

(10) Patent No.: US 6,303,985 B1
(45) Date of Patent: *Oct. 16, 2001

(54) SEMICONDUCTOR LEAD FRAME AND PACKAGE WITH STIFFENED MOUNTING PADDLE

(75) Inventors: Charles Larson, Nampa; John Fernandez, Boise, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,858

(22) Filed: Nov. 12, 1998

(51) Int. Cl.$^7$ .................................................. H01L 23/495
(52) U.S. Cl. .................... 257/676; 257/669; 257/672; 257/674; 257/782
(58) Field of Search ................... 257/676, 670, 257/671, 666, 669, 672, 674, 782; 361/723, 813

(56) References Cited

U.S. PATENT DOCUMENTS

| | | | |
|---|---|---|---|
| 4,712,129 | * 12/1987 | Orcutt ................................. | 257/739 |
| 4,803,540 | * 2/1989 | Moyer et al. ....................... | 257/666 |
| 4,918,511 | * 4/1990 | Brown ................................. | 257/669 |
| 4,952,999 | * 8/1990 | Robinson et al. .................. | 257/666 |
| 5,126,820 | * 6/1992 | Brown ................................. | 257/420 |
| 5,214,307 | * 5/1993 | Davis .................................. | 257/676 |
| 5,389,739 | * 2/1995 | Mills ................................... | 257/666 |
| 5,578,871 | * 11/1996 | Fierkens ............................. | 257/676 |
| 5,594,234 | 1/1997 | Carter, Jr. et al. ................. | 257/676 |
| 5,610,437 | * 3/1997 | Frechette .......................... | 257/676 |
| 5,760,465 | * 6/1998 | Alcoe et al. ........................ | 257/676 |
| 5,796,162 | * 8/1998 | Huang ................................ | 257/676 |
| 5,859,471 | * 1/1999 | Kuraishi et al. ................... | 257/670 |
| 5,864,174 | * 1/1999 | Yamada et al. .................... | 257/676 |
| 5,920,114 | * 7/1999 | Beaumont ......................... | 257/676 |
| 5,920,116 | * 7/1999 | Umehara et al. .................. | 257/669 |
| 6,075,283 | 6/2000 | Kinsman et al. .................. | 257/676 |
| 6,153,924 | 11/2000 | Kinsman ........................... | 257/666 |

FOREIGN PATENT DOCUMENTS

| | | | |
|---|---|---|---|
| 146330 | * 12/1984 | (EP) | . |
| WO 96/33533 | * 10/1996 | (EP) | . |
| 58-186957 | * 11/1983 | (JP) | . |
| 58-207645 | * 12/1983 | (JP) | . |
| 61-85847 | * 5/1986 | (JP) | . |
| 61-128551 | * 6/1986 | (JP) | . |
| 62-168615 | * 7/1987 | (JP) | . |
| 1-251748 | * 10/1989 | (JP) | . |
| 1-278755 | * 11/1989 | (JP) | . |
| 4-139866 | * 5/1992 | (JP) | . |
| 4-168759 | * 6/1992 | (JP) | . |

* cited by examiner

*Primary Examiner*—Olik Chaudhuri
*Assistant Examiner*—Alonzo Chambliss
(74) *Attorney, Agent, or Firm*—Stephen A. Gratton

(57) ABSTRACT

A semiconductor lead frame, a semiconductor package, and a method for fabricating semiconductor packages, are provided. The lead frame includes side rails and multiple patterns of lead fingers. The lead frame also includes die mounting paddles associated with the patterns of lead fingers, and support members that attach the mounting paddles to the side rails. The mounting paddles include stiffening members such as indentations, ridges or corrugations formed in a die mounting surface thereof. The stiffening members prevent bowing of the mounting paddles, provide an increased surface area for bonding dice to the mounting paddles, and allow the mounting paddles to flex to accommodate thermal stresses. The support members for the mounting paddles can also have a stiffening cross sectional configuration to help maintain a planar orientation and location of the mounting paddles. The semiconductor package includes a semiconductor die bonded to a rigidified mounting paddle, and a plastic body encapsulating the die and mounting paddle.

38 Claims, 5 Drawing Sheets

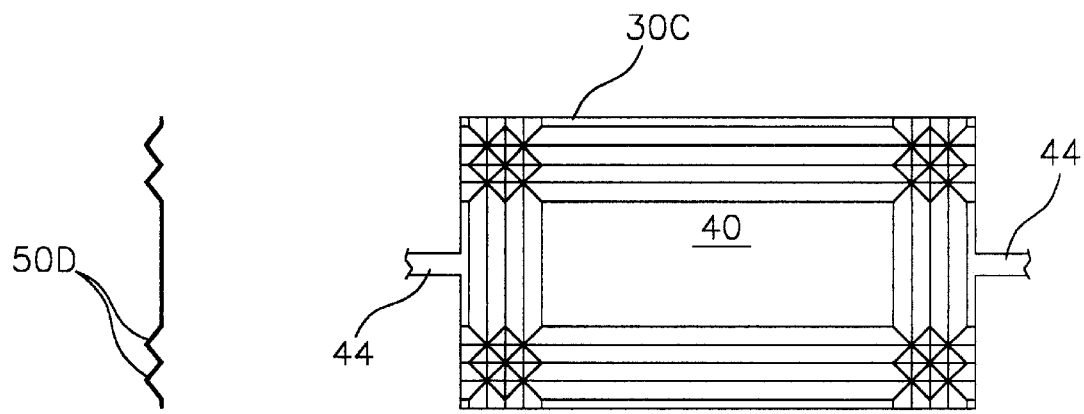
FIGURE 4D-1
FIGURE 4D
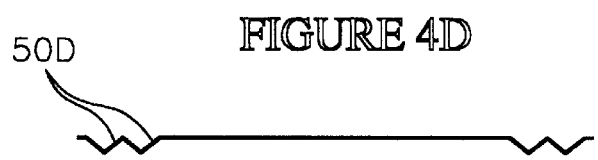
FIGURE 4D-2
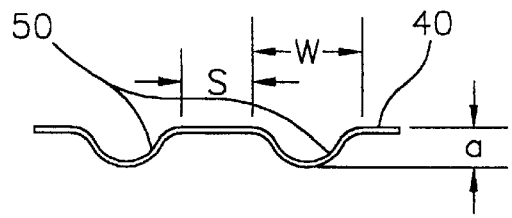
FIGURE 5A
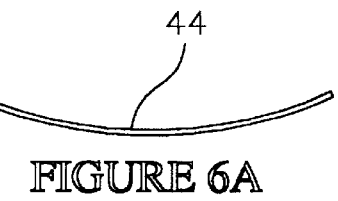
FIGURE 6A
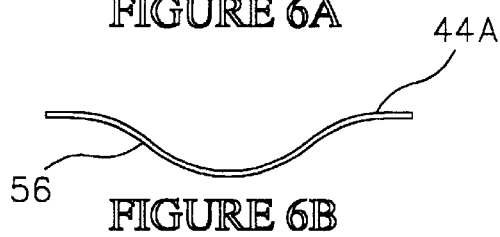
FIGURE 6B
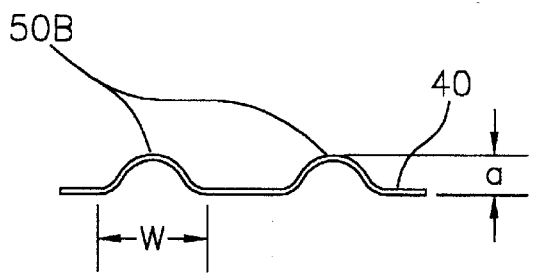
FIGURE 5B
FIGURE 6C
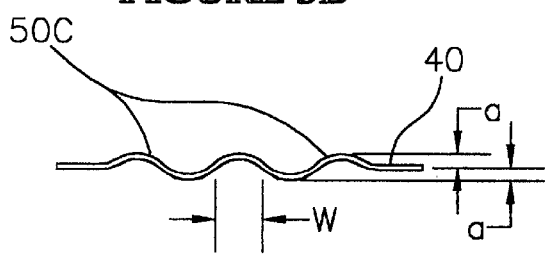
FIGURE 5C
FIGURE 6D PROVIDING A LEAD FRAME COMPRISING, SIDE RAILS, LEAD FINGERS, MOUNTING PADDLES AND SUPPORT MEMBERS FOR ATTACHING THE MOUNTING PADDLES TO THE SIDE RAILS.

PROVIDING THE MOUNTING PADDLES WITH STIFFENING MEMBERS COMPRISING RECESSES, RIDGES OR CORRUGATIONS IN THE MOUNTING PADDLES. THE STIFFENING MEMBERS CONFIGURED TO INCREASE A STIFFNESS AND RIGIDITY OF THE MOUNTING PADDLES, AND TO PREVENT THE MOUNTING PADDLES FROM BOWING.

OPTIONALLY, PROVIDING THE SUPPORT MEMBERS WITH A STIFFENING CROSS SECTION OR RIGIDIFYING RIDGES. THE RIGIDIFIED SUPPORT MEMBERS CONFIGURED TO MAINTAIN A PLANAR ORIENTATION OF THE MOUNTING PADDLES DURING STACKING, HANDLING AND PACKAGING OPERATIONS.

BONDING SEMICONDUCTOR DICE TO THE MOUNTING PADDLES BY FORMING ADHESIVE LAYERS BETWEEN THE DICE AND MOUNTING PADDLES, WITH THE STIFFENING MEMBERS PROVIDING INCREASED SURFACE AREAS FOR THE ADHESIVE LAYERS.

WIRE BONDING THE DICE TO THE LEAD FINGERS.

FORMING PLASTIC PACKAGE BODIES BY ENCAPSULATING THE DICE AND LEAD FINGERS. THE STIFFENING MEMBERS ALLOWING THE MOUNTING PADDLES TO FLEX TO RELIEVE THERMAL STRESSES BETWEEN THE DICE AND PLASTIC BODIES.

SINGULATING THE LEAD FRAME TO SEPARATE THE PLASTIC BODIES.

FIGURE 9

SEMICONDUCTOR LEAD FRAME AND PACKAGE WITH STIFFENED MOUNTING PADDLE

FIELD OF THE INVENTION

This invention relates generally to semiconductor packaging and specifically to lead frames for semiconductor packages, and to methods for fabricating semiconductor packages using lead frames.

BACKGROUND OF THE INVENTION

Plastic semiconductor packages are fabricated using lead frames. A conventional plastic package includes a semiconductor die attached to a lead frame, and encapsulated in a plastic body. The lead frame supports the die during a molding process, and provides the internal traces and terminal leads of the completed package. Typically, the lead frame comprises a stamped or etched metal, such as a nickel-iron alloy, or a copper based alloy. Lead frames are provided in strips adapted to form multiple packages, which are subsequently singulated into individual packages.

One type of lead frame includes planar mounting paddles for the dice, and patterns of lead fingers spaced around the peripheries of the mounting paddles. Prior to the molding process, the backsides of the dice can be attached to the mounting paddles using an adhesive layer. In addition, metal wires can be wire bonded to the lead fingers, and to bond pads on the faces of the dice. Using a transfer molding process, a plastic material, such as an epoxy resin, is molded to either side of the dice and lead frame, and over the wire bonded wires to form package bodies. The lead frame is then singulated into multiple packages, and the lead fingers are trimmed and shaped to form the terminal leads of the packages.

Each semiconductor package includes a semiconductor die attached to a mounting paddle and wire bonded to multiple lead fingers, and a plastic body encapsulating the die and portions of the lead fingers. Sometimes defects can occur in this type of package as a result of bowing of the mounting paddle. For example, bowing can result from thermal stresses developing between the metal mounting paddle and the plastic body of the package. The thermal stresses occur because a coefficient of thermal expansion (CTE) for the mounting paddle is different than a CTE of the plastic body. Bowing of the mounting paddle resulting from the thermal stresses, can cause the plastic body to crack, or to delaminate, from the lead frame.

Defects can also occur in this type of package as a result of defects in the adhesive layer formed between the die and the mounting paddle. For example, the adhesive layer can have a varying thickness, and discontinuous portions where there is no adhesive material. These defects can cause the die to pop loose from the mounting paddle, or can cause cracking in the package body. One method for controlling the thickness of the adhesive layer is by forming bumps on the mounting paddle, and then pressing the die into contact with the bumps. This method is disclosed in U.S. Pat. No. 5,214,307, to Davis.

Yet another source of defects in plastic packages results from an orientation and location of the mounting paddles with respect to other components of the lead frame. Typically, the mounting paddles include support members on either end, which attach to spaced side rails of the lead frame. These support members are sometimes referred to as "tie bars". The support members are relatively thin segments of metal formed continuously with the mounting paddles and side rails. Twisting and bending of the support members during stacking and handling of the lead frame, and during the semiconductor packaging process, can change the orientation and location of a mounting paddle, and of a die attached to the mounting paddle. This can cause defects in a subsequently formed plastic body, and in the bond lines between the plastic body and the lead frame.

In view of these and other deficiencies in conventional lead frames, improvements in lead frames, and in fabrication methods for semiconductor packages, are needed in the art.

SUMMARY OF THE INVENTION

In accordance with the present invention, an improved lead frame, an improved semiconductor package, and an improved method for fabricating semiconductor packages using the lead frame, are provided.

The lead frame includes spaced side rails, and multiple patterns of lead fingers attached to the side rails. The lead frame also includes stiffened mounting paddles, and stiffened support members which attach the mounting paddles to the side rails.

Each mounting paddle includes one or more stiffening members in the form of either indentations, ridges, or corrugations (i.e., indentations alternating with ridges) extending across a length or width of the mounting paddle. The stiffening members increase the stiffness and structural rigidity of the mounting paddles in the lead frame, and also in the completed semiconductor package. Accordingly, the mounting paddles are less likely to bow during handling and packaging, which permits semiconductor packages to be constructed with fewer defects. In addition, the stiffening members provide an increased surface area for die bonding, and provide a structure for relieving thermal stresses.

The stiffening members can be formed integrally with the mounting paddles using a stamping process, or alternately using an etching process. In addition, the stiffening members can be formed with a curved cross sectional configuration, or alternately with a v-shaped cross sectional configuration. Further, the stiffening members can be oriented generally parallel to a longitudinal axis of the lead frame and mounting paddles, generally transverse to a longitudinal axis of the lead frame and mounting paddles, or in a criss cross pattern.

In addition to the stiffened mounting paddles, the support members for the mounting paddles also have a cross sectional configuration adapted to provide increased stiffness and structural rigidity for the mounting paddles. In illustrative embodiments, the support members for the mounting paddles can be formed with a curved cross sectional configuration, or alternately with a ribbed cross sectional configuration. The stiffened support members help to prevent planar misalignment of the mounting paddles during handling and stacking of the lead frame, and also during packaging operations performed with the lead frame.

A semiconductor package constructed in accordance with the invention comprises: a stiffened mounting paddle and a pattern of lead fingers; a semiconductor die adhesively bonded to the mounting paddle; bond wires bonded to the lead fingers and die; and a molded plastic body encapsulating the die and portions of the lead fingers. The package can also include stiffened support members for supporting the mounting paddle on the lead frame.

A method for fabricating semiconductor packages in accordance with the invention comprises the steps of: providing a lead frame comprising lead fingers and stiffened mounting paddles; adhesively bonding semiconductor dice to the mounting paddles; wire bonding the dice to the lead fingers; encapsulating the dice and lead frame; and then singulating the lead frame into separate packages. The method can also include the step of providing the lead frame with stiffened support members for preventing misalignment of the mounting paddles.

BRIEF DESCRIPTION OF THE DRAWINGS

FIG. 4A-1 is a side elevation view of FIG. 4A;

FIG. 4B-1 is an end elevation view of FIG. 4B;

FIG. 4C-1 is an end elevation view of FIG. 4C;

FIG. 4D is an enlarged plan view equivalent to FIG. 4A of an alternate embodiment mounting paddle having v-shaped stiffening members formed in a criss cross pattern on the lead frame;

FIG. 4D-1 is an end elevation view of FIG. 4D;

FIG. 4D-2 is a side elevation view of FIG. 4D;

FIG. 5A is a cross sectional view taken along section line 5A—5A of FIG. 4A wherein the stiffening members comprise indentations;

FIG. 5B is a cross sectional view equivalent to FIG. 5A of an alternate embodiment mounting paddle having stiffening members that comprise ridges;

FIG. 5C is a cross sectional view equivalent to FIG. 5A of an alternate embodiment mounting paddle having stiffening members that comprise corrugations;

FIG. 6A is a cross sectional view taken along section line 6A—6A of FIG. 4A showing a concave shape of a support member for the mounting paddle;

FIG. 6B is a cross sectional view equivalent to FIG. 6A showing an alternate embodiment support member having an indented stiffening rib;

FIG. 6C is a cross sectional view equivalent to FIG. 6A showing an alternate embodiment convex support member;

FIG. 6D is a cross sectional view equivalent to FIG. 6A showing an alternate embodiment support member having a raised stiffening rib;

FIG. 9 is a block diagram showing steps in a method for fabricating the semiconductor package of FIG. 8A in accordance with the invention.

DETAILED DESCRIPTION OF THE PREFERRED EMBODIMENTS

Figure 1:
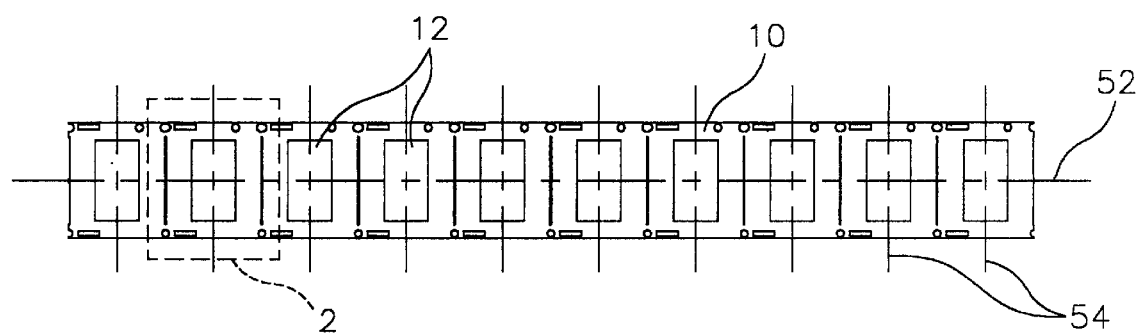
FIG. 1 is a schematic plan view of a lead frame constructed in accordance with the invention.
Figure 2:
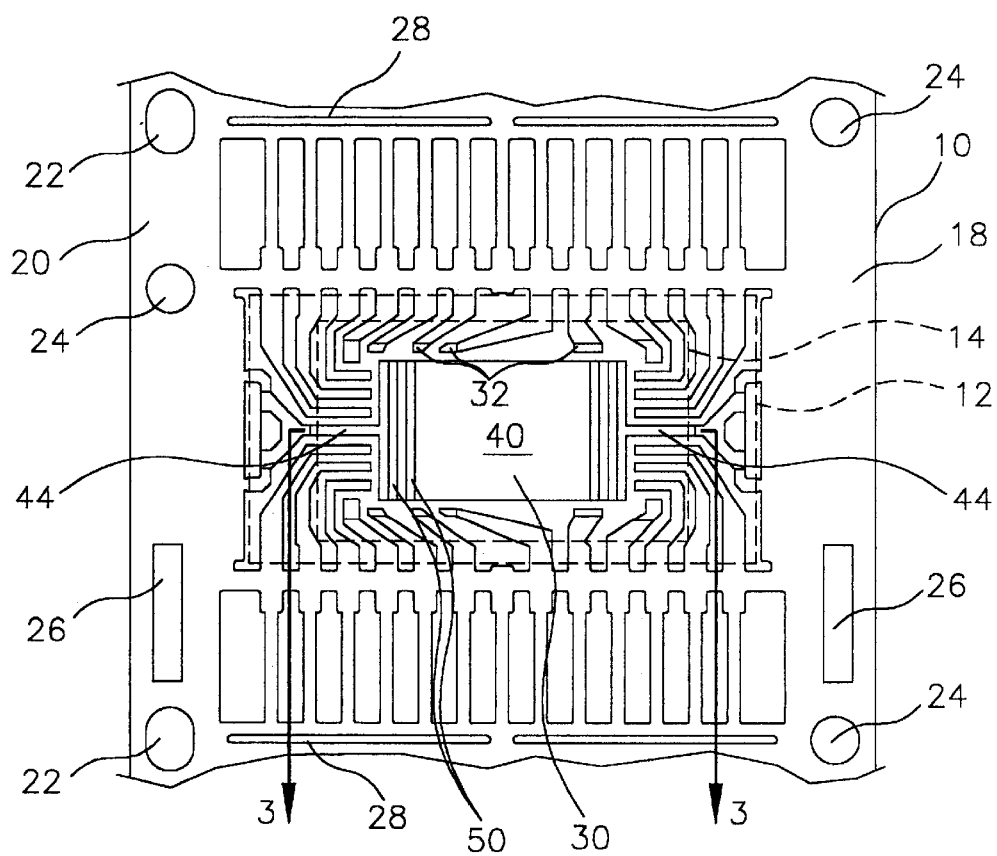
FIG. 2 is an enlarged portion of FIG. 1 taken along section line 2—2 of FIG. 1.
Figure 3:
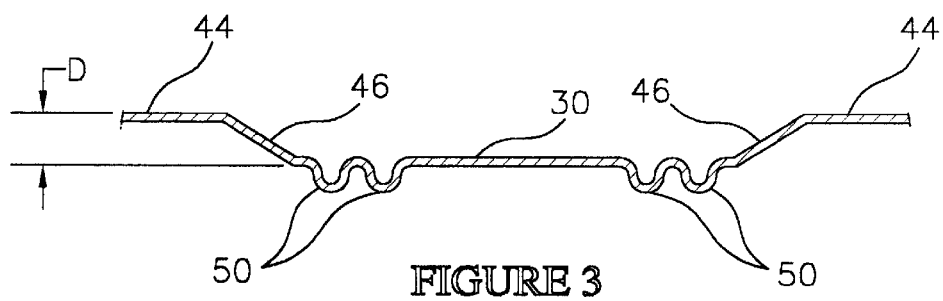
FIG. 3 is a cross sectional view taken along section line 3—3 of FIG. 2 showing a mounting paddle of the lead frame.

Referring to FIGS. 1–3, a lead frame 10 constructed in accordance with the invention is shown. The lead frame 10 initially comprises a strip of material which includes multiple die mounting sites 12 (FIG. 1). In an illustrative embodiment, the lead frame 10 includes ten die mounting sites 12. However, this number is merely exemplary, and a greater or lesser number of die mounting sites 12 can be employed.

Figure 8A:
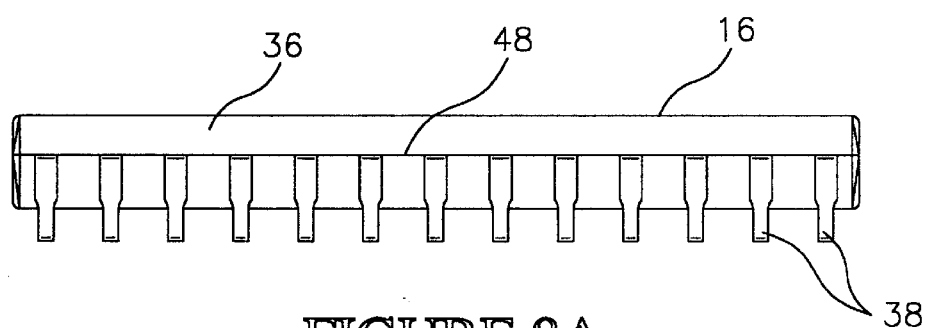
FIG. 8A is a side elevation view of a semiconductor package constructed in accordance with invention.

Each die mounting site 12 can be used to attach a semiconductor die 14 (FIG. 8B) to the lead frame 10 to form a single semiconductor package 16 (FIG. 8A). In FIG. 2 the die mounting site 12 and die 14 are represented by dotted lines. Following a molding step in which plastic bodies 36 (FIG. 8A) of the semiconductor packages 16 (FIG. 8A) are molded to the lead frame 10, the lead frame 10 can be cut or sheared into a plurality of separate packages 16 (FIG. 8A).

As shown in FIG. 2, the lead frame 10 includes parallel spaced side rails 18, 20 having multiple through openings 22, 24, 26. The side rails 18, 20 and openings 22, 24, 26 permit the lead frame 10 to be handled by automated transfer mechanisms associated with chip bonders, wire bonders, molds, trim and form machinery, and marking machinery. The lead frame 10 also include elongated openings 28 to facilitate singulation of the lead frame 10 into separate packages 16. The lead frame 10 can be formed of metal using a stamping process, or a chemical milling process. Suitable metals for the lead frame 10 include nickel-iron alloys (e.g., 42% Ni-58% Fe), clad materials (e.g., copper clad stainless steel), or copper alloys.

Figure 8B:
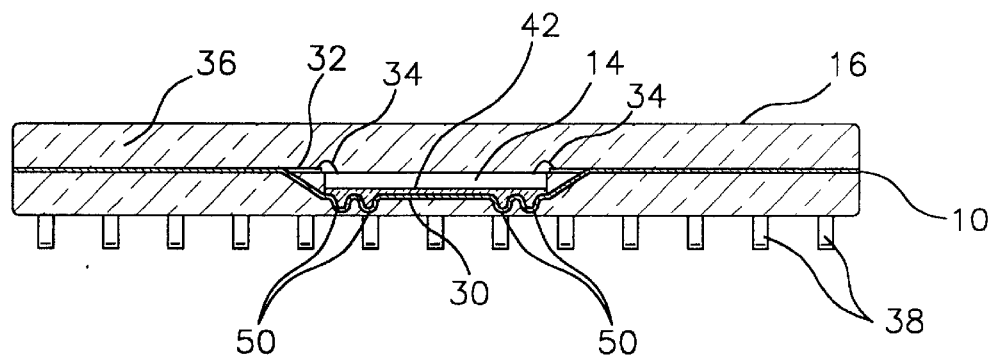
FIG. 8B is a cross sectional view of the semiconductor package of FIG. 8A.

As also shown in FIG. 2, each die mounting site 12 includes a die mounting paddle 30, and a pattern of lead fingers 32 which surround the mounting paddle 30 in a required pattern. Following the molding step, wires 34 (FIG. 8B) will be wire bonded to the lead fingers 32 and to bonding pads (not shown) on the die 14 (FIG. 8B). The lead fingers 32 will form the internal signal traces for the semiconductor package 16. Also, terminal portions of the lead fingers 32 will be trimmed and formed to form the terminal leads 38 (FIG. 8A) of the semiconductor package 16.

As also shown in FIG. 2, the mounting paddle 30 includes a die mounting surface 40 wherein the die 14 will be mounted. During attachment of the die 14 to the lead frame 10, a backside of the die 14 can be adhesively bonded to the mounting paddle 30. Accordingly, the mounting paddle 30 has a peripheral shape which corresponds to a peripheral shape of the die 14. In the illustrative embodiment, the mounting paddle 30 has a generally rectangular peripheral shape. However, the mounting paddle 30 can also be configured in other peripheral shapes, such as square. A peripheral size of the mounting paddle 30 can be slightly larger than a peripheral size of the die 14.

The die 14 will subsequently be attached to the mounting paddle 30 using an adhesive layer 42 (FIG. 8B). The adhesive layer 42 can comprise an epoxy, acrylic, silicone or polyimide material. Alternately, the adhesive layer 42 can comprise a polymer tape, such as "KAPTON" tape. For attaching the die 14 to the mounting paddle 30, a manual process, or an automated process can be employed. For an automated process, a conventional chip bonder used in the production of conventional semiconductor packages for bonding dice to lead frames can be utilized.

As also shown in FIG. 2, the mounting paddle 30 includes support members 44 which connect the mounting paddle 30 to the siderails 18, 20 of the lead frame 10. The support members 44 bifurcate at the connection points with the side rails 18, 20. As shown in FIG. 3, downset portions 46 of the support members 44 provide an offset for the die mounting surface 40 of the mounting paddle 30, relative to surfaces of the lead fingers 32. This offset facilitates molding of the die 14 to the lead frame 10, and provides an optimal location for a bond line 48 (FIG. 8A) of the package 16 (FIG. 8A). However, it is to be understood that the support members 44 can also be constructed without a downset and without bifurcated segments.

Figure 4A:
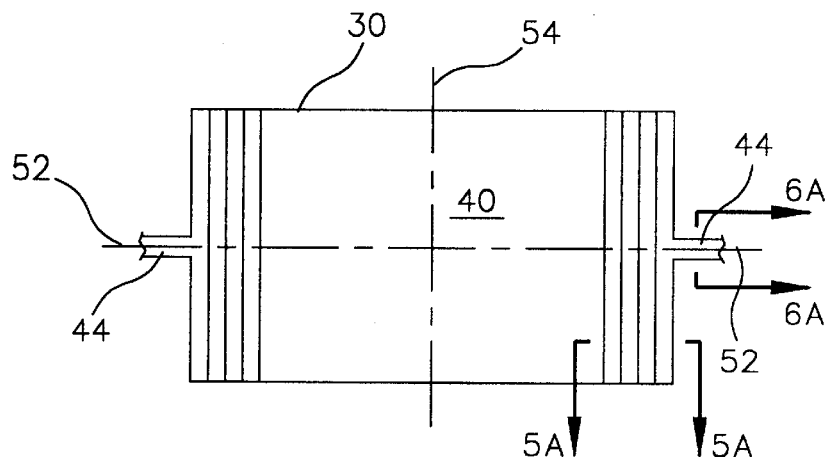
FIG. 4A is an enlarged plan view of the mounting paddle having curved stiffening members oriented generally perpendicular to a longitudinal axis of the lead frame.
Figures 1, 4A:
Figures 1, 4B:
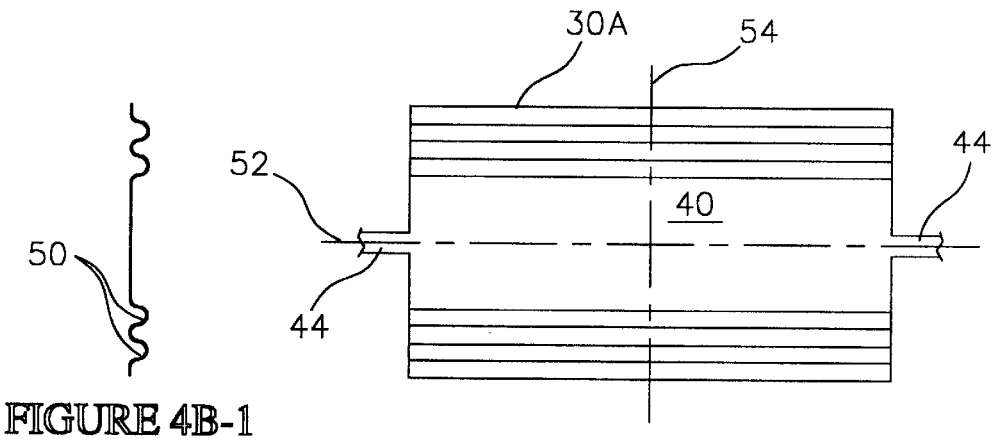
FIG. 4B is an enlarged plan view equivalent to FIG. 4A of an alternate embodiment mounting paddle having curved stiffening members oriented generally parallel to a longitudinal axis of the lead frame.

Referring to FIGS. 4A and 4A-1, the mounting paddle 30 is shown separately from a remainder of the lead frame 10. In addition to the die mounting surface 40 and the support members 44, the mounting paddle 30 includes a plurality of stiffening members 50. In the embodiment of FIG. 4A, the stiffening members 50 are elongated members oriented generally perpendicular to a longitudinal axis 52 of the lead frame 10, and generally parallel to a lateral axis 54 of the mounting paddle 30. In an alternate embodiment, mounting paddle 30A shown in FIGS. 4B and 4B-1, the stiffening members 50 are elongated members oriented generally parallel to the longitudinal axis 52 of the lead frame 10, and generally perpendicular to the lateral axis of the mounting paddle 30A.

The stiffening members 50 are formed in the die mounting surface 40 of the mounting paddle 30. The mounting paddle 30 is illustrated with two stiffening members 50 proximate to each lateral edge of the mounting paddle 30. However, it is to be understood that a greater or lesser number of stiffening members 50 can be provided. Similarly, in the mounting paddle 30A of FIG. 4B, there are two stiffening members 50A proximate to each longitudinal edge of the mounting paddle 30. However, a greater or lesser number of stiffening members 50A can be employed.

As shown in FIG. 5A, the stiffening members 50 comprise indentations in the die mounting surface 40. The stiffening members 50 extend across the width of the mounting paddle 30 from a first longitudinal edge thereof, to a second longitudinal edge thereof. The entire surface of the die mounting surface 40 can include stiffening members 50, or the stiffening members 50 can be formed on selected portions of the die mounting surface 40 (e.g., along lateral or longitudinal edges thereof).

In addition, the stiffening members 50 can be recessed with respect to the die mounting surface 40 by a distance "a". By way of example, the distance "a" can be from 5 mils (0.128 mm) to 10 mils (0.256 mm). In general, mounting paddles 30 for thin packages, such as TSOPs, can be closer to the lower limit (5 mils) and mounting paddles 30 for other types of packages, such as SOJ, can be closer to the upper limit (10 mils). A representative range for a width "w" of the stiffening members 50 can be from 5 mils (0.128 mm) to 20 mils (0.512 mm). A spacing "s" between the stiffening members 50 can be selected as required, and can be approximately equal to the width "w".

The stiffening members 50 are preferably stamped integrally with the mounting paddle 30 during stamping of the lead frame 10. However, the stiffening members can also be formed using an etching process (e.g., etched grooves). As will be further explained, during the subsequent packaging process, the die 14 is supported by the die mounting surface 40, and the stiffening members 50 will be at least partially filled by the adhesive layer 42.

Referring to FIG. 5B, alternate embodiment stiffening members 50B comprise raised members, or ridges, on the die mounting surface 40. The stiffening members 50B have a width "w" and project from the die mounting surface 40 by the distance "a". In this embodiment, the stiffening members 50B can be used to space the die 14 from the die mounting surface 40 by an exact amount. The space between the die 14 and the die mounting surface 40 can be filled by the adhesive layer 42, which will have a thickness approximately equal to the distance "a".

Referring to FIG. 5C, alternate embodiment stiffening members 50C alternate between being raised above the die mounting surface 40 by the distance "a", or being recessed by the distance "a". In the embodiment of FIG. 5C, the stiffening members 50C can be described as being "corrugations", and the die mounting surface 40 can be described as being "corrugated".

Figures 1, 4C:
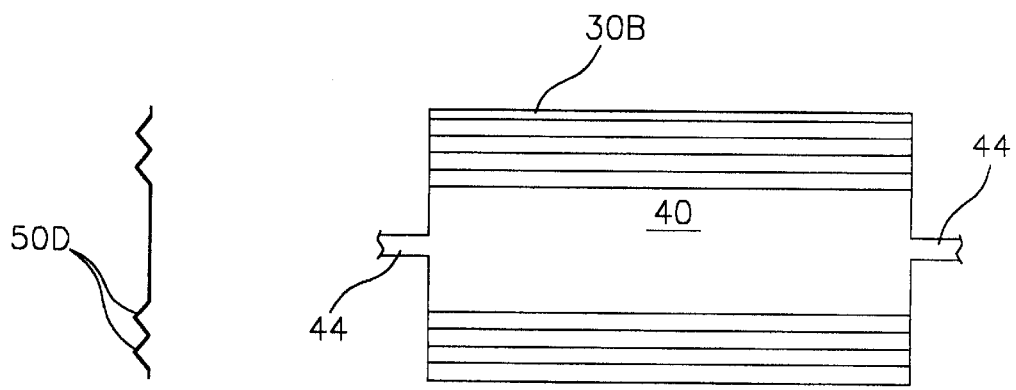
FIG. 4C is an enlarged plan view equivalent to FIG. 4A of an alternate embodiment mounting paddle having v-shaped stiffening members oriented generally parallel to a longitudinal axis of the lead frame.

Referring to FIGS. 4C and 4C-1, an alternate embodiment mounting paddle 30B includes longitudinally oriented stiffening members 50D having a generally v-shaped cross sectional configuration. The v-shaped stiffening members 50D function substantially the same as the curved stiffening members previously described.

Referring to FIGS. 4D, 4D-1 and 4D-2 another alternate embodiment mounting paddle 30C includes v-shaped stiffening members 50D having a criss-cross configuration.

In each of the embodiments, the stiffening members 50A–50D stiffen the mounting paddles 30A—30C so that bowing of the mounting paddles during stacking and handling of the lead frame 10, and during the packaging process is less likely. In addition, the position of the mounting paddles 30A–30C relative to the lead fingers 32 and other elements of the lead frame 10 can thus be maintained during wire bonding and other packaging operations. The stiffening members 50A–50D also prevent bowing of the mounting paddles 30A–30C in the completed package 16.

Further, the stiffening members 50A-50D provide flexibility in the X direction (or the Y direction) for the mounting paddles 30A–30C. This flexibility allows the mounting paddles 30A–30C to relieve thermal stresses in the package 16 due to temperature variations. Still further, the stiffening members 50A–50D provide an increased surface area for bonding to the adhesive layer 42 (FIG. 7), and thus improve the adhesive bond between the die 14 and die mounting surface 40.

Referring to FIGS. 6A–6D, representative cross sectional configurations for the support members 44 of the mounting paddles 30A–30C are illustrated. As shown in FIG. 6A, the support members 44 can have a curved cross sectional configuration. In addition, the support members 44 can be bowed inwardly with respect to the die mounting surface 40 (e.g., concave shape). In FIG. 6B, support members 44A have a stiffening rib 56 that is recessed with respect to the die mounting surface 40. In FIG. 6C, support members 44B are bowed outwardly with respect to the die mounting surface 40 (e.g., convex shape). In FIG. 6D, support members 44C have a stiffening rib 56 that is raised with respect to the die mounting surface 40.

As is apparent, these cross sectional configurations are merely exemplary and others can be used to provide increased stiffness and structural rigidity for the support members 44–44C. In each of the embodiments, the rigidified support members 44–44C maintain a planar orientation and location of the mounting paddles 30A–30C during stacking and handling of the lead frame 10, and during packaging operations performed using the lead frame 10.

Figure 7:
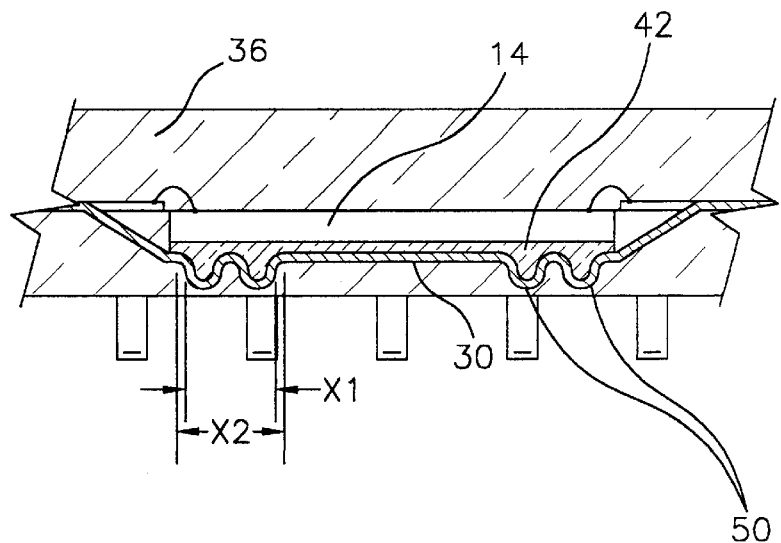
FIG. 7 is a schematic cross sectional view showing a semiconductor die bonded to the mounting paddle using an adhesive layer.

Referring to FIG. 7, different features of the lead frame 10 are schematically illustrated. In FIG. 7, the size of the stiffening members 50 is exaggerated to illustrate the adhesive layer 42 filling the stiffening members 50. This construction provides an increased surface area for forming the adhesive layer 42, and for bonding the die 14 to the mounting paddle 30. The adhesive bond between the die 14 and mounting paddle 30 is thus improved. In addition, the stiffening members 50 increase the flexibility of the mounting paddle 30 in X or Y directions, which improves the performance of the package 16 at different temperatures. In particular, the increased flexibility allows the mounting paddle 30 to flex, as indicated by X1 and X2, to relieve thermal stresses between the die 14 and the mounting paddle 30.

Referring to FIGS. 8A and 8B, the semiconductor package 16 constructed using the lead frame 10 is illustrated. The package 16 includes the semiconductor die 14 adhesively bonded to the mounting paddle 30 using adhesive layer 42. In addition, the package 16 includes the wires 34 bonded to the lead fingers 32 and to the die 14. Terminal portions of the lead fingers 32 form the terminal leads 38 for the package 16. The package 16 also includes the plastic body 36 which encapsulates the die 14 and the lead frame 10.

Referring to FIG. 9, steps in a method for fabricating the package 16 using the lead frame 10 are illustrated.

A. Providing a lead frame comprising, side rails, lead fingers, mounting paddles and support members for attaching the mounting paddles to the side rails.

B. Providing the mounting paddles with stiffening members comprising recesses, ridges or corrugations in the mounting paddles. The stiffening members configured to increase a stiffness and rigidity of the mounting paddles, and to prevent the mounting paddles from bowing.

C. Optionally, providing the support members with a stiffening cross section or rigidifying ridges. The rigidified support members configured to maintain a planar orientation of the mounting paddles during stacking, handling and packaging operations.

D. Bonding semiconductor dice to the mounting paddles by forming adhesive layers between the dice and mounting paddles, with the stiffening members providing increased surface areas for the adhesive layers.

E. Wire bonding the dice to the lead fingers.

F. Forming plastic package bodies by encapsulating the dice and lead fingers. The stiffening members allowing the mounting paddles to flex to relieve thermal stresses between the dice and plastic bodies.

G. Singulating the lead frame to separate the plastic bodies.

Thus the invention provides a semiconductor lead frame having stiffened mounting paddles and support members for the mounting paddles. The lead frame can be used to fabricate improved semiconductor packages. In particular, stiffening members on the mounting paddles allow the mounting paddles to resist bowing and flexing during fabrication and use of the package. In addition, the stiffening members increase a surface area for adhesively bonding dice to the lead frame, and allow the mounting paddles to flex to accommodate thermal stresses.

Although the invention has been described with reference to certain preferred embodiments, as will be apparent to those skilled in the art, certain changes and modifications can be made without departing from the scope of the invention, as defined by the following claims.

We claim:

1. A semiconductor lead frame comprising:
   a die mounting paddle configured to support a semiconductor die for packaging, the paddle having a length and a width, the paddle comprising a die mounting surface, and a stiffening member on the surface configured to stiffen the paddle, the stiffening member extending across the length or the width of the paddle; and
   a support member attaching the paddle to the lead frame having a longitudinal axis and a stiffening cross sectional configuration extending generally parallel to the axis that is curved to increase a stiffness thereof and to maintain a planar orientation of the paddle.

2. The lead frame of claim 1 wherein the support member has a generally concave shape with respect to the die mounting surface.

3. The lead frame of claim 1 wherein the support member has a generally convex shape with respect to the die mounting surface.

4. The lead frame of claim 1 wherein the length of the mounting paddle is oriented along the axis.

5. The lead frame of claim 1 wherein the stiffening member extends across the width and is oriented generally perpendicular to the axis.

6. The lead frame of claim 1 wherein the stiffening member comprises a member selected from the group consisting of indentations, grooves and corrugations.

7. A semiconductor lead frame comprising:
   a pair of spaced side rails;
   a die mounting paddle attached to the side rails comprising a die mounting surface and a plurality of stiffening members in the surface, each stiffening member extending across a length or a width of the paddle and comprising an element selected from the group consisting of indentations, ridges, and corrugations;
   a first support member attached to the first edge of the paddle and to a first side rail of the pair; and
   a second support member attached to the second edge of the paddle and to a second side rail of the pair;
   the first support member and the second support member each having a longitudinal axis and a stiffening curved cross sectional configuration extending generally parallel to the axis configured to increase a stiffness and a structural rigidity thereof and to maintain a planar orientation of the paddle.

8. The lead frame of claim 7 wherein the stiffening members extend across the length of the paddle.

9. The lead frame of claim 7 wherein the stiffening members extend across the width of the paddle.

10. The lead frame of claim 7 wherein the stiffening members comprise indentations having generally v-shaped cross sectional configurations.

11. The lead frame of claim 7 wherein the stiffening members comprise indentations having generally curved cross sectional configurations.

12. A semiconductor lead frame comprising:
   a pair of spaced side rails;
   a die mounting paddle between the side rails comprising a die mounting surface and a plurality of stiffening members in the surface extending across a length or a width of the paddle; and
   a support member attaching the paddle to the side rails and having a longitudinal axis, the support member comprising a rib having a stiffening curved cross sectional configuration extending generally parallel to the axis.

13. The lead frame of claim 12 wherein the stiffening members extend across the width.

14. The lead frame of claim 12 wherein the stiffening members are generally perpendicular to one another.

15. A semiconductor lead frame comprising:
a pair of spaced side rails;
a pattern of lead fingers between the side rails;
a die mounting paddle between the side rails proximate to the lead fingers, the paddle comprising a die mounting surface and a plurality of corrugations in the surface extending across a length and a width of the paddle and configured to stiffen the paddle and to maintain a position of the mounting paddle relative to the lead fingers; and
a pair of support members configured to attach the paddle to the side rails and to maintain a planar orientation of the paddle, the support members having longitudinal axes and stiffening curved cross sectional configurations extending generally parallel to the axes.

16. The lead frame of claim 15 wherein the corrugations have a criss cross pattern including a plurality of first corrugations generally parallel to the side rails and a plurality of second corrugations generally perpendicular to the first corrugations.

17. The lead frame of claim 15 wherein the corrugations have a v-shaped cross section.

18. The lead frame of claim 15 wherein the corrugations are raised or alternately recessed with respect to the die mounting surface.

19. A semiconductor package comprising:
a lead frame comprising:
a die mounting paddle comprising a die mounting surface and a stiffening member on the surface extending across a length or a width of the paddle and configured to stiffen the mounting paddle;
a support member attaching the paddle to the lead frame having a longitudinal axis and a stiffening curved cross sectional configuration extending generally parallel to the axis configured to increase a stiffness thereof and to maintain a planar orientation of the paddle;
a semiconductor die attached to the die mounting paddle; and
an encapsulant at least partially encapsulating the die and the lead frame.

20. The package of claim 19 wherein the stiffening member comprises a member selected from the group consisting of indentations, grooves and corrugations.

21. The package of claim 19 wherein the stiffening member extends across the length of the paddle.

22. A semiconductor package comprising:
a portion of a lead frame comprising a plurality of lead fingers, a die mounting paddle having a length and a width, the paddle comprising a die mounting surface and a plurality of corrugations formed in the surface of the paddle in a criss cross configuration across the length and the width configured to stiffen the paddle, and a support member for attaching the paddle to the lead frame, the support member having a longitudinal axis and a stiffening curved cross sectional configuration extending generally parallel to the axis;
a semiconductor die bonded to the surface in electrical communication with the lead fingers; and
an encapsulant at least partially covering the die and the paddle.

23. The package of claim 22 wherein the corrugations comprise indentations or v-grooves.

24. The package of claim 22 further comprising an adhesive layer on the surface and in the corrugations attaching the die to the paddle.

25. A semiconductor package comprising:
a semiconductor die;
a lead frame comprising:
a die mounting paddle comprising a die mounting surface and a plurality of stiffening members formed in the surface and extending across a length and a width of the paddle, the stiffening members configured to stiffen the paddle, to provide an increased surface area for adhesively bonding the die to the paddle, and to provide a structure for relieving thermal stresses in the package;
a support member having a longitudinal axis for attaching the die mounting paddle to the lead frame, the support member comprising a rib configured to increase a rigidity thereof, the rib having a stiffening curved cross sectional configuration extending generally parallel to the axis; and
an adhesive layer attaching the die to the surface.

26. The package of claim 25 wherein the stiffening members comprise a plurality of corrugations in a criss cross pattern.

27. The package of claim 25 wherein the stiffening members extend across the length.

28. The package of claim 25 wherein the stiffening members comprise a plurality of indentations.

29. The package of claim 25 wherein the curved cross sectional configuration is concave or convex with respect the surface of the paddle.

30. A method for fabricating a semiconductor package comprising:
providing a semiconductor die;
providing a lead frame comprising a die mounting paddle having a plurality of stiffening members extending across a length or a width of the paddle, the stiffening members configured to stiffen the paddle, to provide an increased surface area for adhesively bonding the die to the lead frame, and to provide a structure for relieving thermal stresses in the package, each stiffening member comprising an element selected from the group consisting of indentations, ridges and corrugations, and a support member attaching the paddle to the lead frame having a longitudinal axis and a curved stiffening cross sectional configuration extending generally parallel to the axis configured to increase a stiffness thereof and to maintain a planar orientation of the paddle;
attaching the die to the paddle; and
encapsulating at least a portion of the die and paddle.

31. The method of claim 30 wherein the stiffening members comprise a plurality of indentations in a surface of the paddle.

32. The method of claim 30 wherein the stiffening members comprise corrugations in a surface of the paddle.

33. The method of claim 30 wherein the stiffening members comprise a plurality of ridges in a surface of the paddle.

34. A method for fabricating a semiconductor package comprising:
providing a semiconductor die;
providing a lead frame comprising a plurality of lead fingers and a die mounting paddle proximate the lead fingers, the paddle comprising a surface, a plurality of stiffening members on the surface extending across a length or a width thereof, and a support member having a longitudinal axis for attaching the die mounting paddle to the lead frame, the support member comprising a rib configured to increase a rigidity thereof, the rib having a stiffening curved cross sectional configuration extending generally parallel to the axis;

attaching the die to the surface;

wire bonding the die to the lead fingers with the stiffening members preventing bowing of the paddle; and encapsulating the die and the paddle in a plastic body with the stiffening members preventing bowing of the paddle and the support member maintaining a planar orientation of the paddle.

35. The method of claim 34 wherein the stiffening members comprise a plurality of indentations.

36. The method of claim 34 wherein the stiffening members comprise a plurality of corrugations.

37. The method of claim 34 wherein the stiffening members comprise a plurality of corrugations in a criss cross pattern.

38. The method of claim 34 wherein the stiffening members extends across the width of the paddle.

* * * * *